(12) United States Patent
Menard et al.

(10) Patent No.: US 9,496,155 B2
(45) Date of Patent: Nov. 15, 2016

(54) METHODS OF SELECTIVELY TRANSFERRING ACTIVE COMPONENTS

(75) Inventors: Etienne Menard, Limoges (FR); Joseph Carr, Chapel Hill, NC (US)

(73) Assignee: Semprius, Inc., Durham, NC (US)

( * ) Notice: Subject to any disclaimer, the term of this patent is extended or adjusted under 35 U.S.C. 154(b) by 612 days.

(21) Appl. No.: 13/638,019

(22) PCT Filed: Mar. 22, 2011

(86) PCT No.: PCT/US2011/029357
§ 371 (c)(1),
(2), (4) Date: Jun. 7, 2013

(87) PCT Pub. No.: WO2011/123285
PCT Pub. Date: Oct. 6, 2011

(65) Prior Publication Data
US 2013/0273695 A1    Oct. 17, 2013

Related U.S. Application Data

(60) Provisional application No. 61/318,508, filed on Mar. 29, 2010.

(51) Int. Cl.
*H01L 21/00* (2006.01)
*H01L 23/34* (2006.01)
(Continued)

(52) U.S. Cl.
CPC .......... *H01L 21/58* (2013.01); *H01L 21/02304* (2013.01); *H01L 21/6835* (2013.01); *H01L 23/3142* (2013.01); *H01L 24/26* (2013.01); *H01L 24/80* (2013.01); *H01L 25/03* (2013.01);
(Continued)

(58) Field of Classification Search
CPC ................ H01L 21/6835; H01L 21/58; H01L 2221/6835; H01L 23/3142; H01L 21/02304; H01L 24/26; H01L 25/03
See application file for complete search history.

(56) References Cited

U.S. PATENT DOCUMENTS 6,872,635 B2 *   3/2005   Hayashi et al. ............... 438/463
6,972,204 B2 *   12/2005  Oohata et al. ................... 438/22
(Continued)

FOREIGN PATENT DOCUMENTS

WO    WO 2008/033680 A2    3/2008

OTHER PUBLICATIONS

International Preliminary Report on Patentability and Written Opinion, PCT/US2011/029357 mailed Oct. 11, 2012.
Hamer et al., "63.2 AMOLED Displays Using Transfer-Printed Integrated Circuits", 2009 SID International Symposium, Society for Information Display, Los Angeles, USA, May 31, 2009, pp. 947-950.
International Search Report and Written Opinion, PCT/US2011/029357 mailed Jul. 27, 2011.

*Primary Examiner* — Alonzo Chambliss
(74) *Attorney, Agent, or Firm* — Myers Bigel & Sibley. P.A.

(57) ABSTRACT

A method for selectively transferring active components (22) from a source substrate (20) to a destination substrate (10) includes providing a source substrate with one or more active components located on the source substrate, providing a destination substrate, locating a selectively curable adhesive layer (30) between and adjacent to the destination substrate and the source substrate, selecting one or more active components (22A), selectively curing area(s) (32A) of the adhesive layer corresponding to the selected active components to adhere the selected active components to the destination substrate, and removing the source substrate from the destination substrate leaving the selected active components adhered to the destination substrate in the selected areas.

24 Claims, 13 Drawing Sheets

(51) Int. Cl.
    *B29C 63/00*       (2006.01)
    *H01L 21/58*       (2006.01)
    *H01L 23/00*       (2006.01)
    *H01L 21/02*       (2006.01)
    *H01L 23/31*       (2006.01)
    *H01L 21/683*      (2006.01)
    *H01L 25/03*       (2006.01)

(52) U.S. Cl.
    CPC ............ *H01L 2221/6835* (2013.01); *H01L 2221/68363* (2013.01); *H01L 2221/68368* (2013.01); *H01L 2924/12042* (2013.01); *H01L 2924/12044* (2013.01)

(56) References Cited

U.S. PATENT DOCUMENTS

| | | | |
|---|---|---|---|
| 7,015,055 B2 * | 3/2006 | Oohata | G09F 9/33 438/108 |
| 7,195,687 B2 * | 3/2007 | Hayashi | H01L 21/6835 156/241 |
| 8,257,538 B2 * | 9/2012 | Doi | H01L 21/6835 156/241 |
| 8,334,152 B2 * | 12/2012 | Speier | H01L 33/0079 257/E21.06 |
| 2005/0148106 A1 * | 7/2005 | Iwafuchi et al. | 438/22 |
| 2005/0158904 A1 * | 7/2005 | Hayashi | H01L 21/6835 438/34 |
| 2005/0233546 A1 * | 10/2005 | Oohata et al. | 438/458 |
| 2010/0071206 A1 | 3/2010 | Kerr et al. | |

* cited by examiner

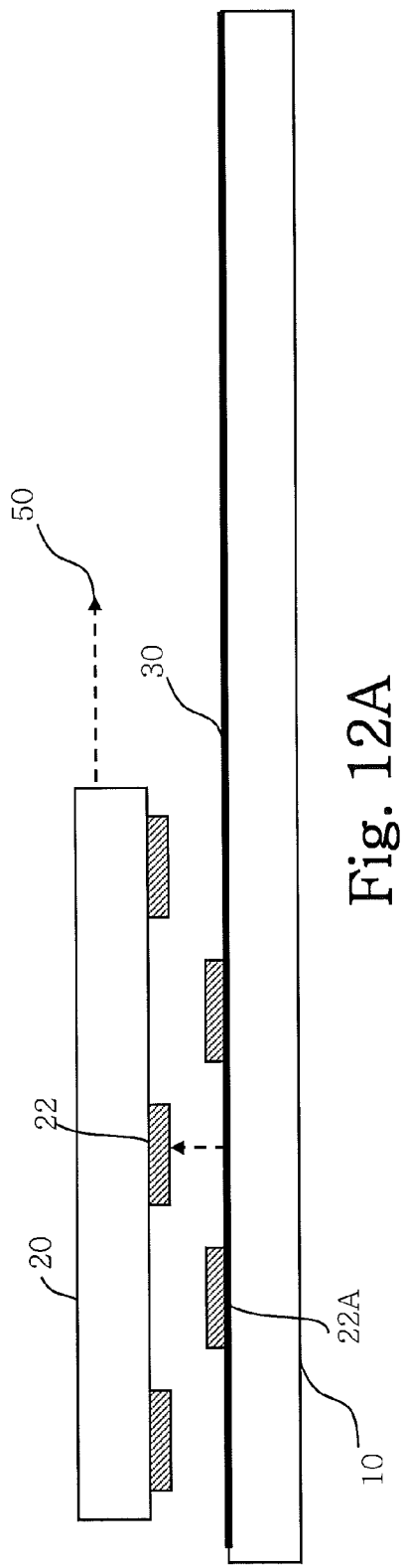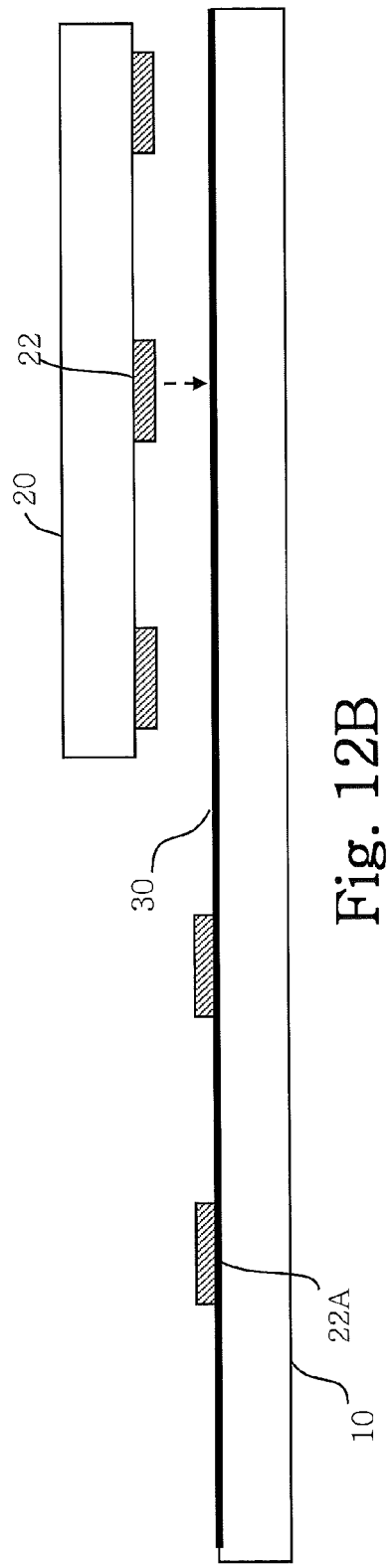

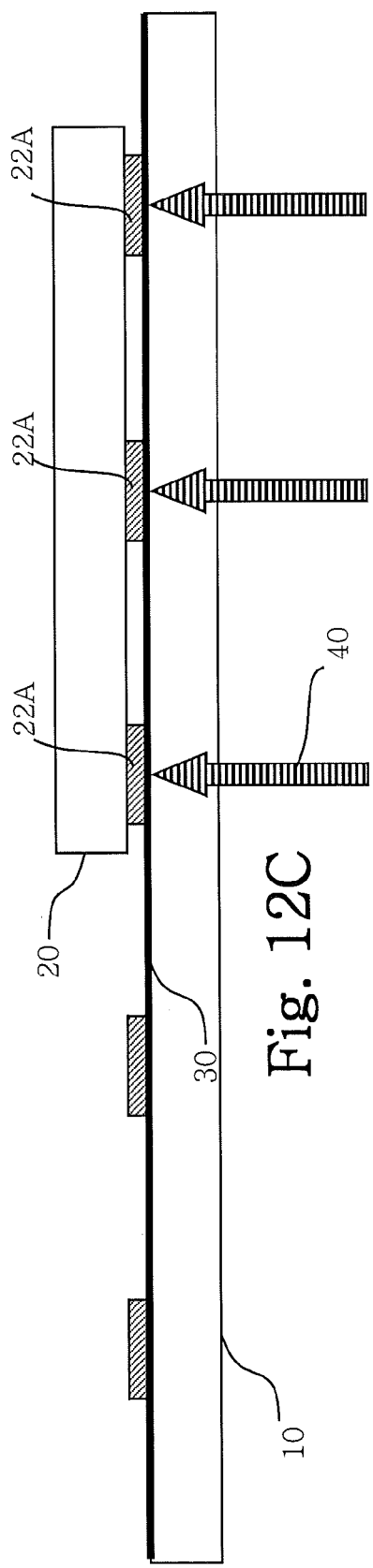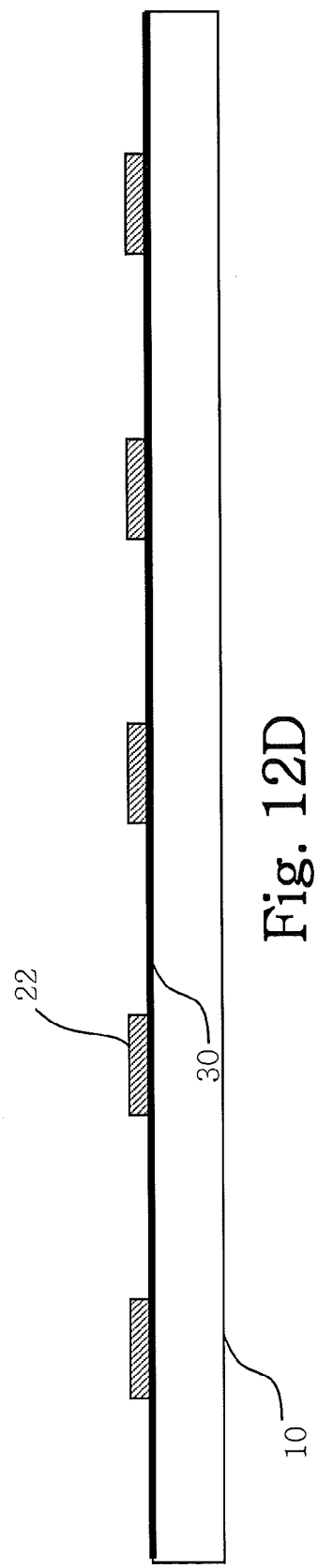

US 9,496,155 B2

METHODS OF SELECTIVELY TRANSFERRING ACTIVE COMPONENTS

CLAIM OF PRIORITY

The present application is a 35 U.S.C. §371 national phase application of PCT International Application No. PCT/US2011/029357, entitled "Selective Transfer Of Active Components", having an international filing date of Mar. 22, 2011, which claims priority from U.S. Provisional Patent Application No. 61/318,508 entitled "Selective Transfer of Active Components," filed on Mar. 29, 2010 with the United States Patent and Trademark Office, the disclosures of which are incorporated by reference herein in their entireties. The above PCT International Application was published in the English language as International Publication No. WO 2011/123285 A1.

FIELD OF THE INVENTION

The present invention is a method for providing substrates having electrically active components distributed thereon.

BACKGROUND OF THE INVENTION

Large substrates with electronically active components distributed over the extent of the substrate are useful in a variety of electronic systems, for example flat-panel imaging devices such as flat-panel liquid crystal or OLED display devices and in digital radiographic plates. Large substrates with electrically active components are also found in flat-panel solar cells.

The electronically active components are typically formed by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor. The substrate and layer of semiconductor material are typically photo-lithographically processed to define electronically active components, such as transistors. Such transistors are known as thin-film transistors (TFTs) since they are formed in a thin layer of semiconductor material, typically silicon. In these devices, the substrate is often made of glass, for example Corning Eagle or Jade glass designed for display applications. Photo-lithographic methods used to form the active components are known in the art.

These traditional techniques have significant limitations. Despite processing methods used to improve the performance of thin-film transistors, such transistors have performance that is lower than the performance of traditional integrated circuits formed in mono-crystalline semiconductor material. Also, semiconductor material and active components can be needed only on portions of the substrate, leading to wasted material and increased material and processing costs. The substrate materials can be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment needed to process large substrates with thin-film circuitry is relatively expensive.

In an alternative manufacturing technique, a mono-crystalline semiconductor wafer is employed as the substrate. While this approach can provide substrates with similar performance as integrated circuits, the size of such substrates may be limited, for example, to a 12-inch diameter circle, and the wafers are relatively expensive compared to other substrate materials such as glass or polymer.

In yet another approach, thin layers of semiconductor are bonded to a substrate and then processed. Such a method is known as semiconductor-on-glass or silicon-on-glass (SOG) and is described, for example, in U.S. Patent Application 20080224254, dated Sep. 18, 2004. If the semiconductor material is crystalline, high-performance thin-film circuits can be obtained. However, the bonding technique can be expensive and the processing equipment for the substrates to form the thin-film active components on large substrates remains relatively expensive.

Publication number 11-142878 of the Patent Abstracts of Japan entitled "Formation of Display Transistor Array Panel" describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method requires etching a significant quantity of material and risks damaging the exposed TFT array.

An alternative method of locating material on a substrate is described in U.S. Pat. No. 7,127,810. In this method, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects are selectively transferred by employing a plurality of laser beams to abrade selected area. Objects to be transferred can include thin-film circuits. In addition, U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) may be made of a nitride semiconductor on a sapphire substrate. The energy beam is directed to the interface between the sapphire substrate and the LED nitride semiconductor releasing the LED and allowing the LED to adhere to a holding substrate coated with an adhesive. The adhesive is then cured. These methods, however, typically require the patterned deposition of adhesive on the object(s) or on the second substrate. Moreover, the laser beam that irradiates the object should be shaped to match the shape of the object, and the laser abrasion can damage the object to be transferred. Furthermore, the adhesive cure takes time, which typically reduces the throughput of the manufacturing system.

In another method for transferring active components from one substrate to another, described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947, small integrated circuits are formed in a wafer and released from the wafer by etching beneath the circuits. A PDMS stamp is pressed against the wafer and the circuits adhered to the stamp. The circuits are then pressed against a substrate coated with an adhesive, adhered to the substrate, and the adhesive is subsequently cured. This method, however, is susceptible to particulate contamination that can affect the adhesion of the integrated circuits to the stamps, the adhesion of the integrated circuits to the coated substrate, and the position of the integrated circuits on the substrate.

SUMMARY OF THE INVENTION

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some embodiments of the present invention, a method for selectively transferring active components includes providing a curable adhesive layer between a receiving surface and a surface of a substrate including the active components thereon; assembling the substrate on the receiving surface such that the curable adhesive layer contacts the active components and the receiving surface; selectively curing portions of the curable adhesive layer in contact with ones of the active components without curing other portions thereof; and then separating the substrate from the receiving surface such that the ones of the active components on the cured portions of the curable adhesive layer are transferred to the receiving surface.

In some embodiments, an adhesive strength of the cured portions of the adhesive layer is greater than that used to releasably adhere the active components to the substrate.

In some embodiments, the cured portions respectively comprise less than an entirety of a contact area between the respective ones of the active components and the adhesive layer.

In some embodiments, the substrate is a source substrate, and the active components are releasably adhered to the source substrate by a plurality of tethers.

In some embodiments, the method further includes providing a sacrificial layer and an active layer on the source substrate; processing the active layer to define the active components and the plurality of tethers connecting the active components to anchor areas of the active layer; removing portions of the sacrificial layer between the active components and the source substrate such that the active components are releasably adhered to the source substrate by the plurality of tethers.

In some embodiments, the plurality of tethers include an etch-resistant material, and removing the portions of the sacrificial layer includes selectively etching the sacrificial layer without substantially etching the plurality of tethers.

In some embodiments, separating the substrate from the receiving surface includes breaking ones of the plurality of tethers that are connected to the ones of the active components in contact with the cured portions of the adhesive layer.

In some embodiments, selectively curing includes selectively irradiating the portions of the curable adhesive layer with light, heat, and/or electromagnetic energy.

In some embodiments, selectively irradiating includes providing a mask that exposes the portions of the curable adhesive layer in contact with the ones of the active components; and selectively irradiating the portions of the curable adhesive layer exposed by the mask.

In some embodiments, the receiving surface is a surface of an at least partially transparent destination substrate, and selectively irradiating includes
selectively transmitting a laser through the destination substrate to selectively irradiate the portions of the curable adhesive layer in contact with the ones of the active components.

In some embodiments, the substrate and the active components are at least partially transparent, and selectively irradiating includes selectively transmitting a laser through the source substrate and the ones of the active components to selectively irradiate the portions of the curable adhesive layer.

In some embodiments, the receiving surface is a flexible and/or a polymer destination substrate.

In some embodiments, the active layer is a crystalline, microcrystalline, polycrystalline, or amorphous semiconductor layer.

In some embodiments, the active layer has a thickness of greater than about 5 microns.

In some embodiments, the substrate is a stamp, and assembling the substrate on the receiving surface includes pressing the stamp on the receiving surface.

In some embodiments, the method further includes pressing the stamp on a source substrate including the active components releasably adhered thereto; and separating the stamp from the source substrate to transfer the active components from the source substrate to the stamp prior to pressing the stamp on the receiving surface.

In some embodiments, the active components are releasably adhered to the source substrate by a plurality of tethers, and pressing the stamp on the source substrate breaks ones of the plurality of tethers that are connected to the active components.

In some embodiments, the stamp includes a second curable adhesive layer thereon, the active components are first active components releasably adhered to the source substrate, and the source substrate further includes second active components releasably adhered thereto. The method further includes contacting the second curable adhesive layer with the first and second active components on the source substrate when pressing the stamp on the source substrate; and selectively disabling portions of the second adhesive layer in contact with the second active components to delaminate the second active components from the stamp prior to separating the stamp from the source substrate.

In some embodiments, the curable adhesive layer is a first adhesive layer, and the stamp includes a second adhesive layer thereon that releasably adheres the active components to the stamp. The method further includes selectively disabling portions of the second adhesive layer in contact with the ones of the active components prior to separating the stamp from the receiving surface such that an adhesive strength of the cured portions of the first adhesive layer is greater than that of the disabled portions of the second adhesive layer.

In some embodiments, the ones of the active components transferred to the receiving surface are first ones of the active components transferred to a first area of the receiving surface. After separating the substrate from the receiving surface, the method further includes: aligning the substrate with a second area of the receiving surface, the substrate including second ones of the active components remaining thereon; assembling the substrate on the second area of the receiving surface such that the curable adhesive layer contacts second ones of the active components and the receiving surface; selectively curing second portions of the curable adhesive layer in contact with the second ones of the active components; and then separating the substrate from the second area of the receiving surface such that the second ones of the active components on the cured second portions of the curable adhesive layer are transferred to the second area of the receiving surface.

In some embodiments, aligning the substrate includes moving the substrate in one or two dimensions relative to the receiving surface such that the first and second ones of the active components thereon define a one- or two-dimensional array of active components.

In some embodiments, the curable adhesive layer is provided on the receiving surface or on the active components on the substrate.

In some embodiments, the adhesive layer is provided on the active components, and the ones of the active components transferred to the receiving surface are first ones of the active components. After separating the substrate from the receiving surface, the method further includes: assembling the substrate including second ones of the active components remaining thereon on a second receiving surface such that the adhesive layer is in contact with the second ones of the active components and the second receiving surface; and selectively curing portions of the adhesive layer in contact with the second ones of the active components and then separating the substrate from the second receiving surface to transfer the second ones of the active components to the second receiving surface.

In some embodiments, the adhesive layer is provided on the receiving surface, and the active components are first active components. The method further includes: assembling a second substrate including second active components thereon on the receiving surface such that the adhesive layer contacts the second active components; and selectively curing second portions of the adhesive layer in contact with the second active components and then separating the second substrate from the receiving surface to transfer the second active components to the receiving surface.

In some embodiments, after separating the substrate from the receiving surface, the method further includes: cleaning the substrate; and providing second active components on the surface of the substrate for transfer to the receiving surface and/or another receiving surface.

According further embodiments of the present invention, a method for selectively transferring active components from a source substrate to a destination substrate comprises the steps of: a) providing a source substrate having an active side and one or more active components located on the active side of the source substrate; b) providing a destination substrate having a receiving side; c) locating a selectively curable adhesive layer between and adjacent to the receiving side of the destination substrate and the active side of the source substrate, the selectively curable adhesive layer having separate areas between each of the active component(s) and the receiving side of the destination substrate; d) selecting one or more active components having corresponding selected areas; e) selectively curing the adhesive layer in the selected area(s) of the adhesive layer corresponding to the selected active components to adhere the selected active components to the receiving side of the destination substrate in the selected areas; and f) removing the source substrate from the destination substrate leaving the selected active components adhered to the receiving side of the destination substrate in the selected areas.

In some embodiments, step a) comprises the steps of: g) providing a source substrate having a sacrificial layer formed over the source substrate and an active layer formed on the sacrificial layer; h) processing the source substrate to form one or more active component(s) in or on the active layer and a trench around each of the active component(s), the trench extending through the active layer to the sacrificial layer; i) removing the sacrificial layer except for breakable tethers to release the active components from the source substrate, wherein step f) breaks the tethers of the selected active components.

In some embodiments, the method further includes the steps of stripping any sacrificial layer material or active layer material from the source substrate, cleaning the source substrate, forming a second sacrificial layer over the source substrate, forming a second active layer over the second sacrificial layer, and, after step f), repeating steps c) through f).

In some embodiments, step a) comprises the steps of: j) forming one or more active components and; k) releasably adhering the active components to the active side of the source substrate with a releasable adhesive, wherein step f) releases the releasable adhesive in the selected area(s).

In some embodiments, the selectively curable adhesive layer is an adhesive film having a selectively curable adhesive coated on an adhesive carrier.

In some embodiments, the selectively curable adhesive layer is an adhesive coated on the receiving side of the destination substrate or an adhesive coated on the active components.

In some embodiments, the selected area(s) are cured by exposure to a pattern of electromagnetic radiation or a pattern of heat.

In some embodiments, the pattern of electromagnetic radiation or heat is provided by a laser.

In some embodiments, the pattern of electromagnetic radiation is provided by an electromagnetic radiation source through a mask.

In some embodiments, the destination substrate is at least partially transparent and the electromagnetic radiation is provided through the destination substrate.

In some embodiments, the source substrate is at least partially transparent, the active components are at least partially transparent, and the electromagnetic radiation is provided through the source substrate and the selected active components.

In some embodiments, the destination substrate is flexible.

In some embodiments, the destination substrate is a polymer.

In some embodiments, the source substrate is a semiconductor wafer.

In some embodiments, the source substrate is a silicon or a gallium arsenide wafer.

In some embodiments, the active layer is a crystalline, microcrystalline, polycrystalline, or amorphous semiconductor layer.

In some embodiments, the active layer has a thickness greater than 5 microns.

In some embodiments, the selected active components form a regular array in one or two dimensions.

In some embodiments, the method further includes the steps of: 1) after step f), moving the source substrate and the destination substrate relative to each other; and m) repeating steps d), e), and f).

According to still further embodiments, a method for selectively transferring active components from a source substrate to a destination substrate, comprises the steps of: a) providing a source wafer having a sacrificial layer formed over the source wafer and an active layer formed on the sacrificial layer; b) processing the source wafer to form one or more active component(s) in or on the active layer and a trench around each of the active component(s), the trench extending through the active layer to the sacrificial layer; c) removing the sacrificial layer except for breakable tethers to release the active components from the source substrate; d) providing a destination substrate having a receiving side; e) locating a selectively curable adhesive layer between and adjacent to the receiving side of the destination substrate and the active component side of the source wafer, the selectively curable adhesive layer having separate areas between each of the active component(s) and the receiving side of the destination substrate; f) selecting one or more active components; g) selectively curing the adhesive layer in selected area(s) of the adhesive layer corresponding to the selected active components to adhere the selected active components to the receiving side of the destination substrate in the selected area(s); and h) breaking the tethers by removing the source substrate and the adhesive layer from the destination substrate leaving the selected active components adhered to the receiving side of the destination substrate in the selected area(s).

In some embodiments, the active layer is a crystalline semiconductor having thickness equal to or greater than 5 microns.

According to yet further embodiments, a method for selectively transferring active components from a source substrate to a destination substrate, comprises the steps of: a) providing a source substrate having an active side and one or more active components located on the active side of the source substrate; b) providing a destination substrate having a receiving side coated with a selectively curable adhesive; c) providing a stamp; d) pressing the stamp against the active components to adhere the active components to the stamp; e) stamping the active components onto the receiving side of the destination substrate to adhere the first active components to the receiving side of the destination substrate; f) selectively curing the selectively curable adhesive layer in the areas corresponding to the active components; g) removing the stamp from the destination substrate leaving the first active components adhered to the receiving side of the destination substrate.

In some embodiments, the method further includes the step of selectively curing the selectively curable adhesive after the stamp is removed from the receiving side of the destination substrate.

In some embodiments, the method further includes the step of selectively curing the selectively curable adhesive before the stamp is removed from the receiving side of the destination substrate.

In some embodiments, the method further includes the step of selectively curing the adhesive layer by exposing the selectively curable adhesive layer to electromagnetic radiation incident on the selectively curable adhesive layer through the stamp in the areas of the first active components.

According to yet still further embodiments, a method for selectively transferring active components from a source substrate to a destination substrate, comprises the steps of: a) providing a source substrate having an active side and one or more active components located on the active side of the source substrate; b) providing a destination substrate having a receiving side; c) providing a stamp; d) locating a selectively adhesive layer between and adjacent to the stamp and the active side of the source substrate, the selectively adhesive layer having separate areas between each of the active component(s) and the stamp, thereby laminating the active components to the stamp; e) selecting one or more first active components having corresponding first selected areas and one or more remaining second active components having corresponding second selected areas; f) selectively delaminating the selectively adhesive layer in the second selected area(s) and removing the stamp from the source substrate leaving the first active components laminated to the stamp; and g) stamping the first active components onto the receiving side of the destination substrate to adhere the first active components to the receiving side of the destination substrate;

h) removing the stamp from the destination substrate leaving the first active components adhered to the receiving side of the destination substrate.

In some embodiments, the method further includes the step of providing a receiving adhesive layer over the receiving side of the destination substrate.

In some embodiments, the receiving adhesive is curable and the method further includes the step of curing the receiving adhesive layer before the stamp is removed from the receiving side of the destination substrate.

In some embodiments, the receiving adhesive layer is selectively curable and the method further includes the step of selectively curing the receiving adhesive layer by exposing the receiving adhesive layer to electromagnetic radiation incident on the receiving adhesive layer through the stamp in the areas of the first active components.

In some embodiments, the method further includes the step of selectively delaminating the selectively curable adhesive layer in the first selected area(s) before removing the stamp from the destination substrate.

Embodiments of the present invention provide higher-performance active components over large substrates at a reduced cost in materials and manufacturing equipment.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 12A-12D are cross sections of the elements of a device at different stages of construction according to an iterative embodiment of the method of the present invention;

Figure 1:
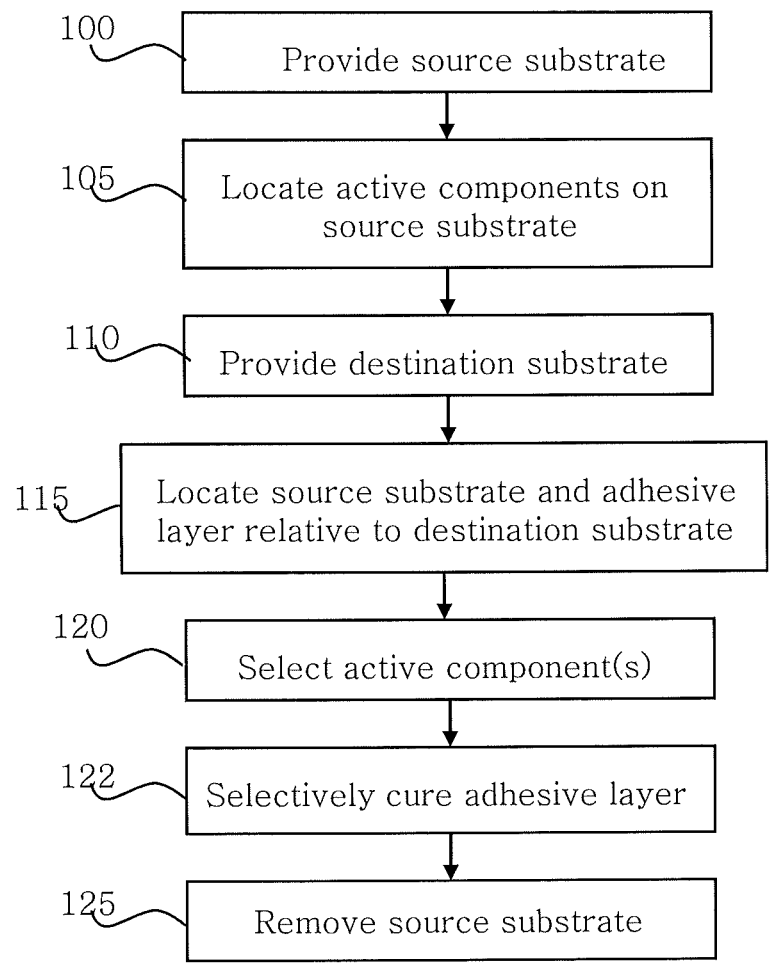
FIG. 1 is a flow diagram illustrating an embodiment of the method of the present invention.

The figures are not drawn to scale since the individual elements of the drawings have too great a size variation to permit depiction to scale.

DETAILED DESCRIPTION OF EMBODIMENTS OF THE INVENTION

The present invention now will be described more fully, hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Figure 2A:
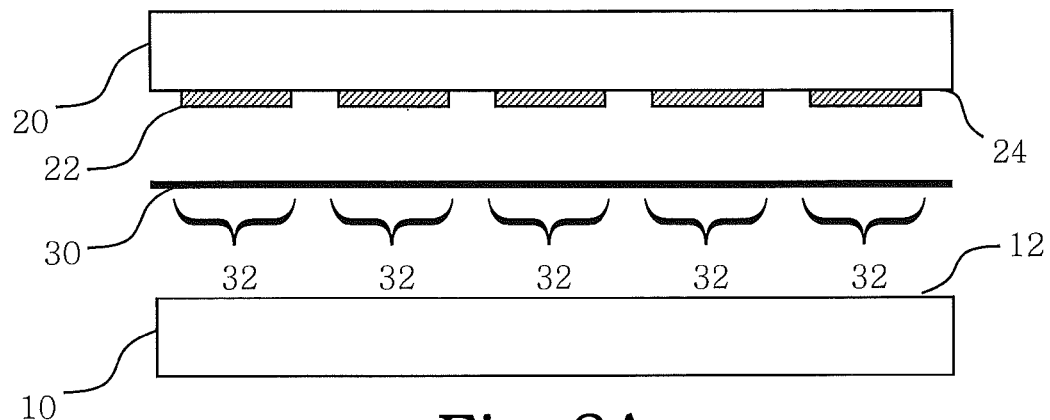
FIGS. 2A-2D are cross sections of the elements of a device at different stages of construction according to an embodiment of the method of the present invention.
Figure 2B:
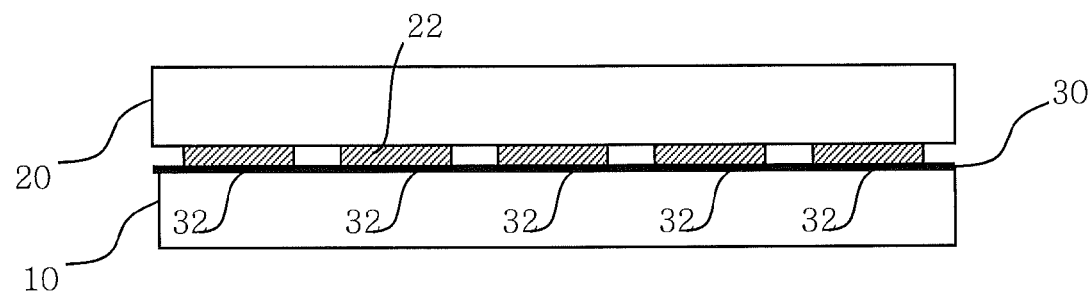

Referring to the flow diagram of FIG. 1 and to the illustrations of FIGS. 2A-2D, one embodiment of the present invention provides a source substrate 20 having an active side 24 of the source substrate 20 in step 100. As shown in FIG. 2A, one or more active components 22 are located on the active side 24 of the source substrate 20 in step 105. A destination substrate or receiving substrate 10 having a receiving side 12 is also provided in step 110. The source substrate 20 and destination substrate 10 can be made separately and at different times or in different temporal orders. The active components 22 can be made separately and then located on the source substrate 20 or can be formed in or on the source substrate 20. Referring also to FIG. 2B, a selectively curable adhesive layer 30 is located between and adjacent to the receiving side 12 of the destination substrate 10 and the active side 24 of the source substrate 20 in step 115. The selectively curable adhesive layer 30 has separate areas 32 between each of the active component(s) 22 and the receiving side 12 of the destination substrate 10. Note that the selectively curable adhesive layer 30 areas 32 are portions of the selectively curable adhesive layer 30 areas that would be in contact with the active components 22 and the receiving side of the destination substrate 10 if the layers are all in contact together in a stack, as illustrated in FIG. 2B.

Figure 2C:
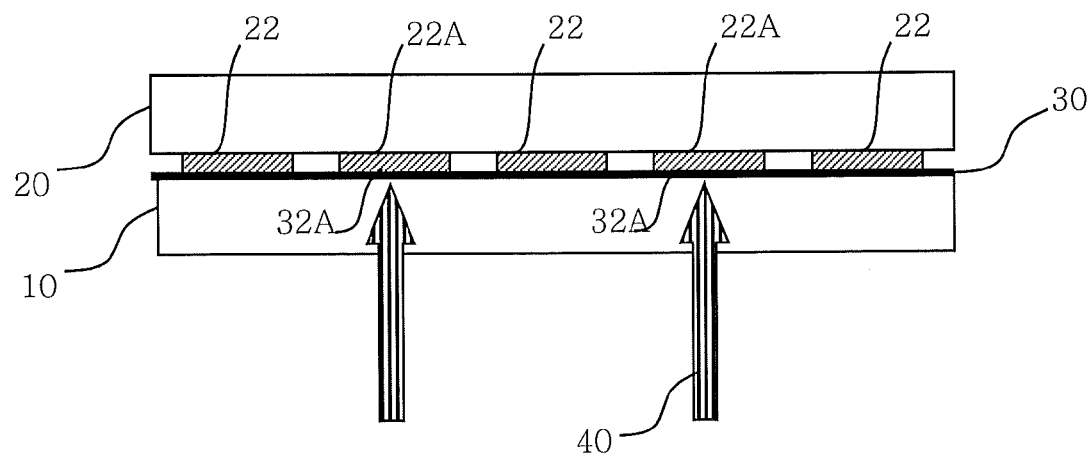
Figure 2D:
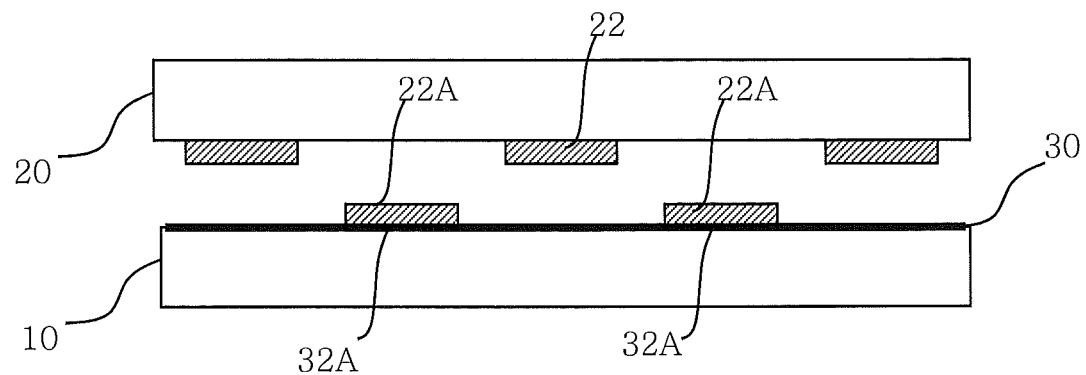

One or more active components 22 are selected in step 120 and, in step 122, the adhesive layer 30 is selectively cured in selected area(s) 32A of the adhesive layer 30 corresponding to the selected active components 22A to adhere the selected active components 22A to the receiving side 12 of the destination substrate in the selected areas 32A. However, other areas of the adhesive layer 30 (for example, areas corresponding to unselected ones of the active components 22) are not cured. As shown in FIG. 2C, for example, the selectively curable adhesive layer 30 is selectively curable through the patterned application of laser light 40. Referring to FIG. 2D, once the adhesive is cured in the selected areas 32A, the source substrate 20 is removed from the destination substrate 10 in step 125, leaving the selected active components 22A adhered to the receiving side of the destination substrate 10 in the selected areas 32A.

Figure 3:
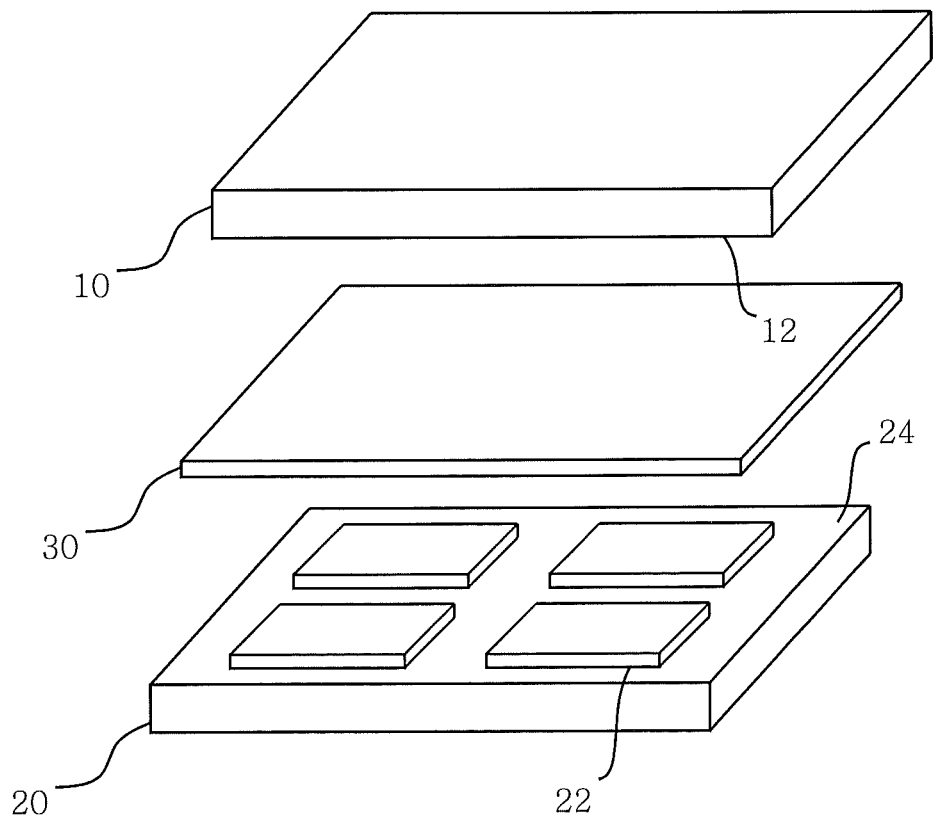
FIG. 3 is a perspective of the device elements illustrated in the cross section of FIG. 2A.

FIG. 3 is an exploded perspective showing the layers of FIG. 2A. In this embodiment, the active components 22 are arranged in a two-dimensional array on the active side 24 of the source substrate 20. The selectively curable adhesive layer 30 is located between the active components 22 and the receiving side 12 of the destination substrate 10.

The adhesive layer 30 can be located on the receiving side 10 of the destination substrate 12 (as illustrated in FIGS. 2A-2D, or it can be applied to the active components 22 and component side 24 of the source substrate 20. When the source substrate 20 is removed from the destination substrate 10 in step 125, the selectively curable adhesive layer 30 can either remain in place on the receiving side 12 of the destination substrate 10 or it can be kept in place on the active component(s) 22 and active side 24 of the source substrate 20.

Suitable selectively curable adhesive layers may include, for example, UV-curable adhesive resins used in the photo-lithographic industry. Adhesives can be applied, for example, as a film on a carrier that is applied to a substrate and the carrier subsequently removed, for example by peeling, leaving an adhesive film on the substrate. Alternatively, uncured liquid adhesives can be coated on the destination substrate, for example by spin coating or curtain coating, or other coating means known in the art. The selectively curable adhesive layer can also be applied to the active components and on the source substrate. A selectively curable adhesive, as used herein, is a material (dry or liquid) that can be cured in some areas, but not others, for example by the patterned application of energy (e.g. electromagnetic energy such as ultra-violet radiation or light, or patterned heat). A laser can be used to provide light or heat to selected areas.

Figure 4:
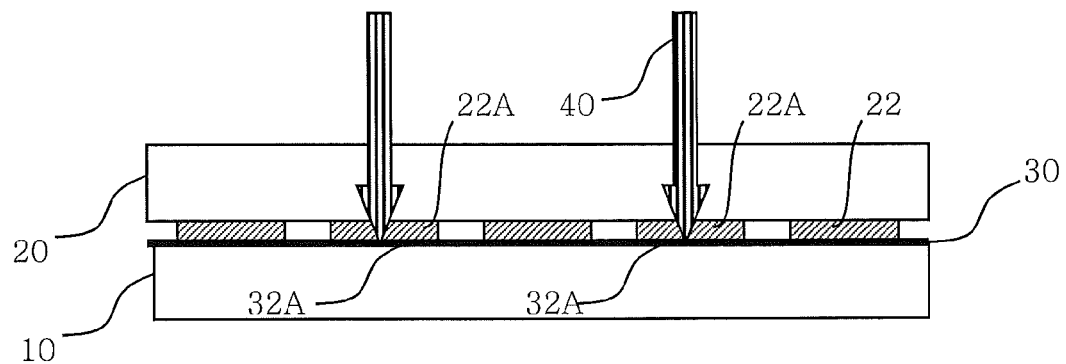
FIG. 4 is a cross section depicting the exposure of selected areas of an adhesive layer according to an embodiment of the method of the present invention.
Figure 5:
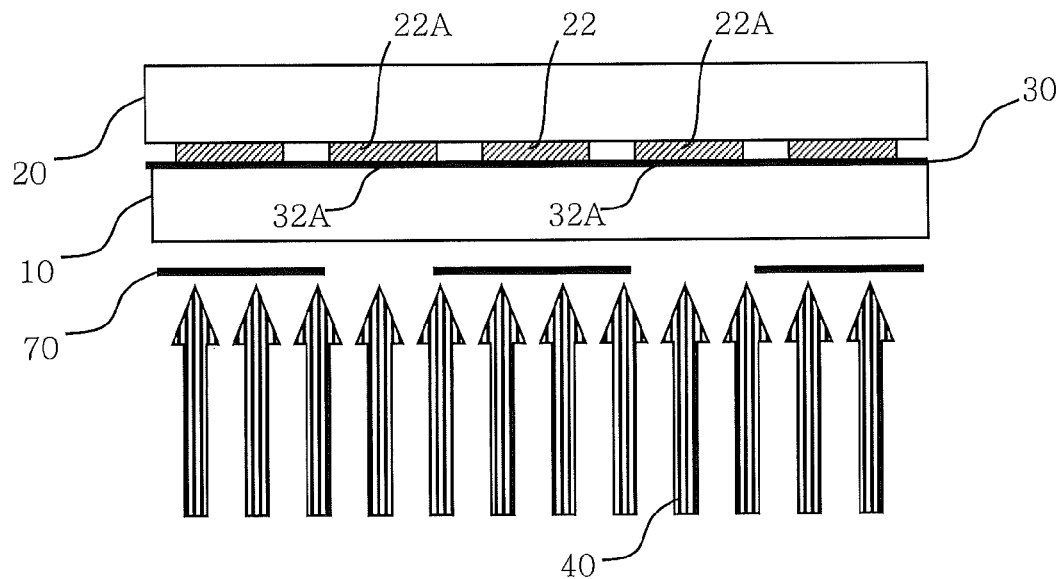
FIG. 5 is a cross section depicting an alternative exposure of selected areas of an adhesive layer according to an alternative embodiment of the method of the present invention.

As shown in FIG. 4, the selected adhesive layer areas can be irradiated through the source substrate 20. In this case, the source substrate 20 must be at least partially transparent, as must the active components 22. In the case (referring back to FIG. 2C) in which the selected adhesive layer areas are irradiated through the destination substrate 10, the destination substrate 10 must be at least partially transparent, while the active components 22 are not necessarily transparent. Alternatively, electromagnetic radiation 40 can be applied through a mask 70, as shown in FIG. 5, to selectively irradiate the selected curable adhesive layer areas.

The selectively curable adhesive can include materials that improve the absorption of light or heat, to improve the rate of curing, for example dyes. The radiation pattern corresponds to the spatial area cured. The selected areas/cured portions may not necessarily correspond exactly to the shape of the active components in some embodiments. Rather, adhesion can be provided to at least a portion of the active component, in contrast to traditional methods that require adhesion of almost the entire surface of the active component to enable transfer. For example, a smaller dot of cured adhesive attached to a larger rectangular active component can be sufficient to effect transfer from the source substrate to the destination substrate in accordance with some embodiments of the present invention. A wide variety of substrate materials are known in the art and can be employed, for example glass, polymers, quartz, and silicon. In particular, glass substrates are widely used in various industries such as display, radiography, and photovoltaics. A variety of active components are also known, for example formed in layers of silicon. In one embodiment of an active component, thin-film transistors are photo-lithographically formed on a thin silicon layer sputtered and possibly processed on a glass substrate. However, such active components typically have lower performance and are mechanically fragile, leading to damage during the transfer process and can lack adequate mechanical robustness.

In some embodiments, the active components are small integrated circuits formed in a semiconductor wafer substrate, for example gallium arsenide or silicon, which can have a crystalline structure. Processing technologies for these materials typically employ high heat and reactive chemicals. However, by employing transfer technologies that do not stress the active component or substrate materials, more benign environmental conditions can be used compared to thin-film manufacturing processes. Thus, the present invention has an advantage in that flexible substrates that are intolerant of extreme processing conditions (e.g. heat, chemical, or mechanical processes) can be employed either for the source or destination substrates. Furthermore, it has been demonstrated that crystalline silicon substrates have strong mechanical properties and, in small sizes, can be relatively flexible and tolerant of mechanical stress. This is particularly true for substrates of 5 micron, 10 micron, 20 micron, 50 micron, or even 100-micron thicknesses. Alternatively, the active layer can be a microcrystalline, polycrystalline, or amorphous semiconductor layer.

Figure 6:
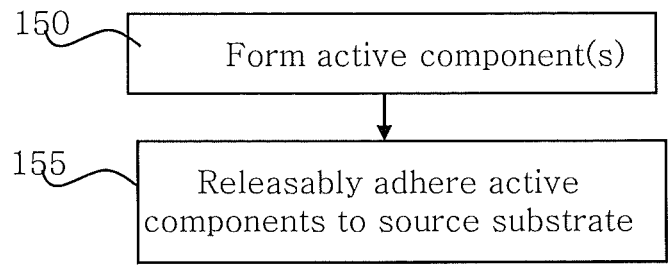
FIG. 6 is a flow diagram illustrating a portion of an embodiment of the method of the present invention.

Referring to the flow diagram of FIG. 6, small integrated circuits can be made using traditional means in step 150 and then releasably adhered to a source substrate in step 155. As used herein, releasably adhered means that a small integrated circuit is sufficiently adhered to a substrate so that ordinary handling of the substrate does not dislodge the small integrated circuit but that the small integrated circuit can be readily removed from the source substrate by using a stronger adhesive or by mechanical handling to pull it off without damaging the small integrated circuit and without the use of chemical processing, for example etching. The process described above can then be applied to transfer the small integrated circuits (active components) to a destination substrate. Note that the releasable adhesive must be strong enough to adhere the small integrated circuits to the source substrate during transport and handling, but weak enough to separate during the step 125 (FIG. 1) of removing the source substrate. The cure of the adhesive layer (step 122) in selected area(s) must provide relatively more adhesion than the releasable adhesive or any other means of adhering the active component(s) to the source substrate, but the adhesive cure does not have to be complete. In a later step, the adhesive layer could be baked to bring the device to a complete state of robust adhesion suitable for a product.

Figure 7:
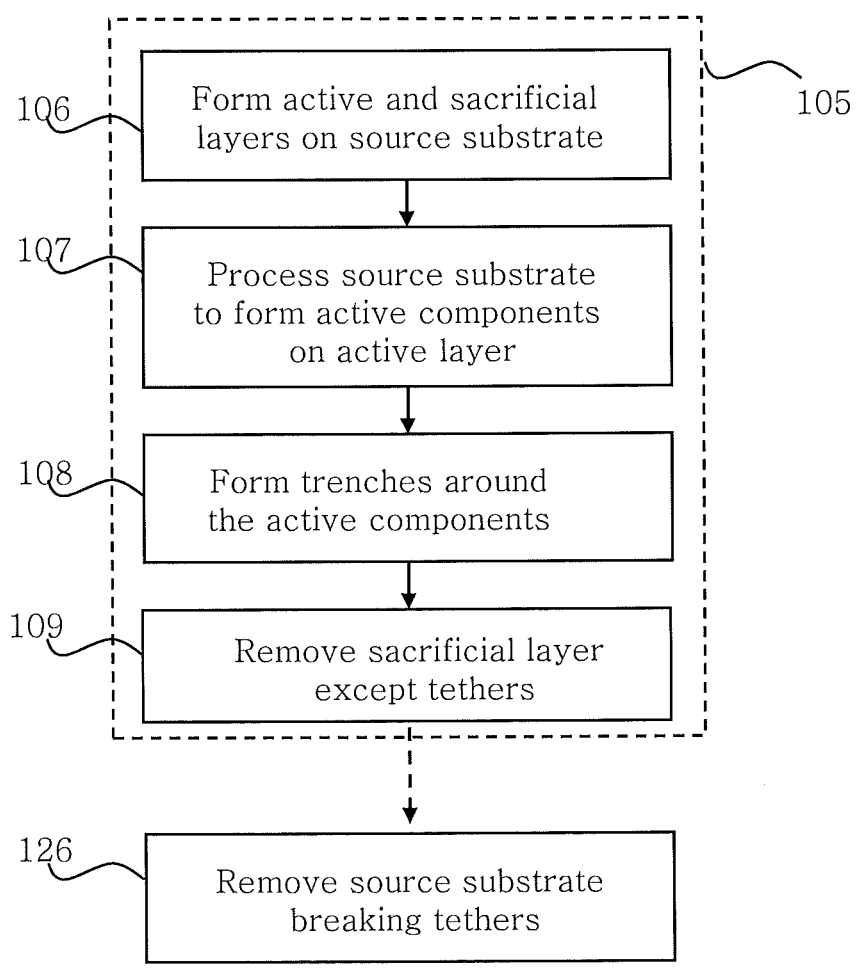
FIG. 7 is a flow diagram illustrating a portion of an alternative embodiment of the method of the present invention.
Figure 8A:
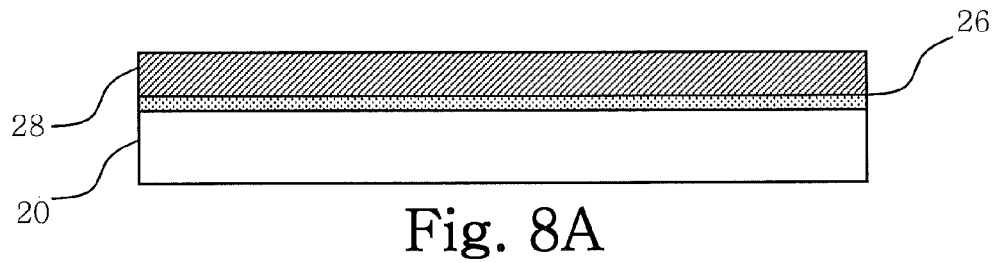
FIGS. 8A-8D are cross sections of elements of a source substrate at different stages of construction according to an embodiment of the method of the present invention.

FIG. 7 is a flow diagram of further methods of providing a source substrate with active components (step 105 of FIG. 1); FIGS. 8A-8D illustrate the method. As shown in FIGS. 7 and 8A, a sacrificial layer 26 is formed on the source substrate 20 and an active layer 28 formed on the sacrificial layer 26 in step 106. The substrate can be, for example, a silicon wafer. The sacrificial layer 26 can be an oxide layer deposited on the wafer. The active layer 28 can be mono-crystalline silicon formed on the oxide layer. Both the sacrificial layer 26 and the active layer 28 can be deposited on the source substrate 20 using standard wafer-processing methods known in the art.

Figure 8B:
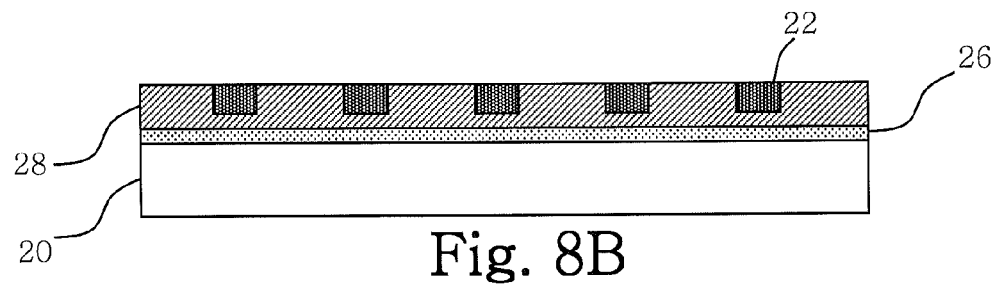

Referring to FIG. 8B, after the sacrificial layer 26 and the active layer 28 are deposited on the source substrate 20, the source substrate 20 can be processed in step 107 to form active components 22 in or on the active layer 28, for example using silicon foundry fabrication process known in the art, Additional layers of material can be added as well as other materials such as metals, oxides, nitrides and other materials known in the integrated-circuit art. Each active component 22 can be complete semiconductor integrated circuits and include, for example, transistors. The active components 22 can have different sizes, for example, 1000 square microns or 10,000 square microns, 100,000 square microns, or 1 square mm, or larger, and can have variable aspect ratios, for example 2:1, 5:1, or 10:1.

Figure 8C:
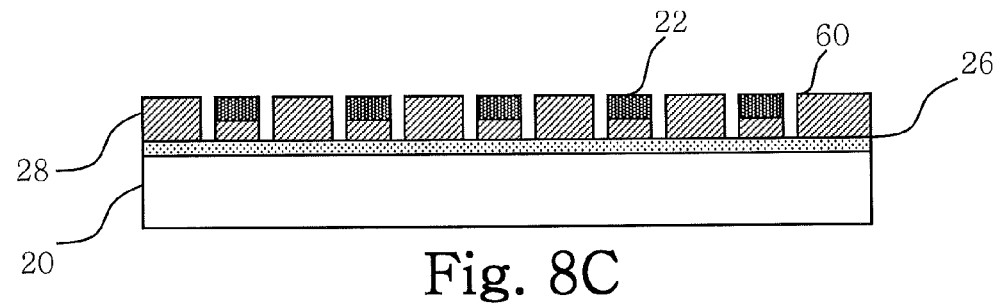

After the active components 22 are formed, as shown in FIG. 8C, trenches 60 can be formed in step 108 around the active components 22 to structurally isolate them from each other. The trench 60 extends through the active layer 28 to the sacrificial layer 26. The trenches 60 can be formed before the active components 22 are processed, or can be formed as a part of the active component formation process.

Figure 8D:
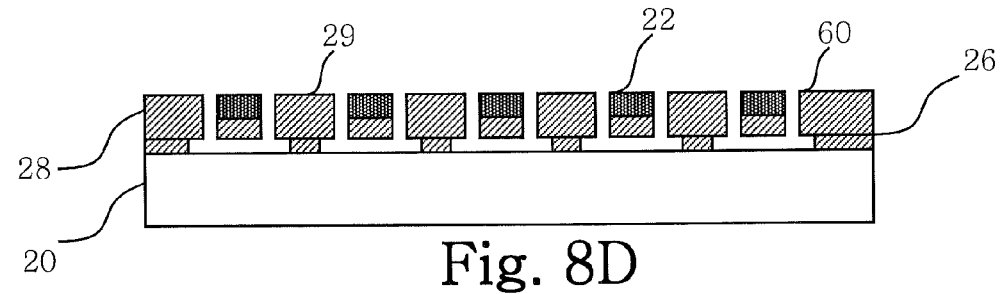
Figure 9:
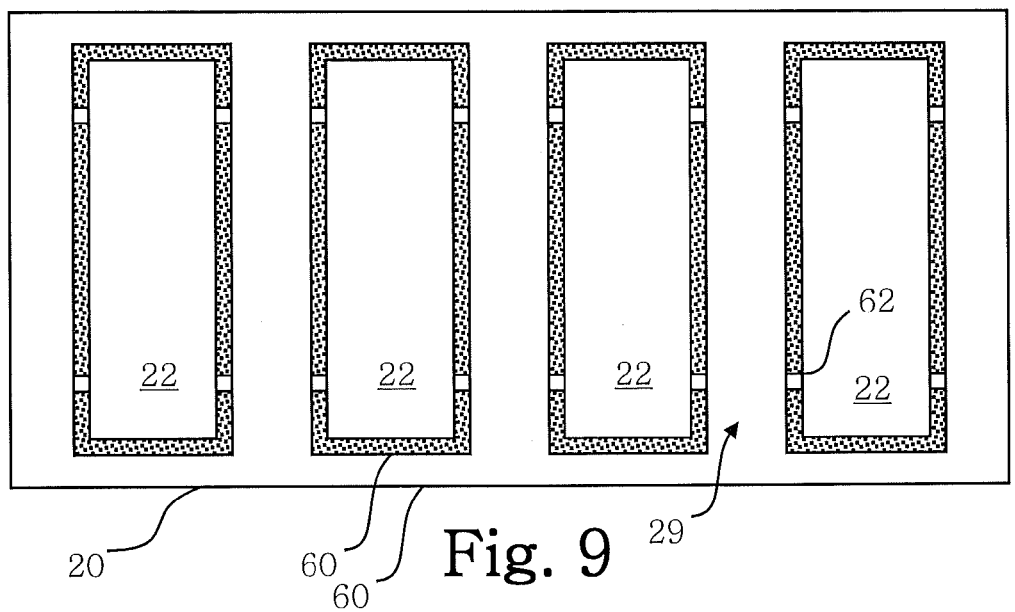
FIG. 9 is a top view depicting the structure of FIG. 8D.
Figure 10A:
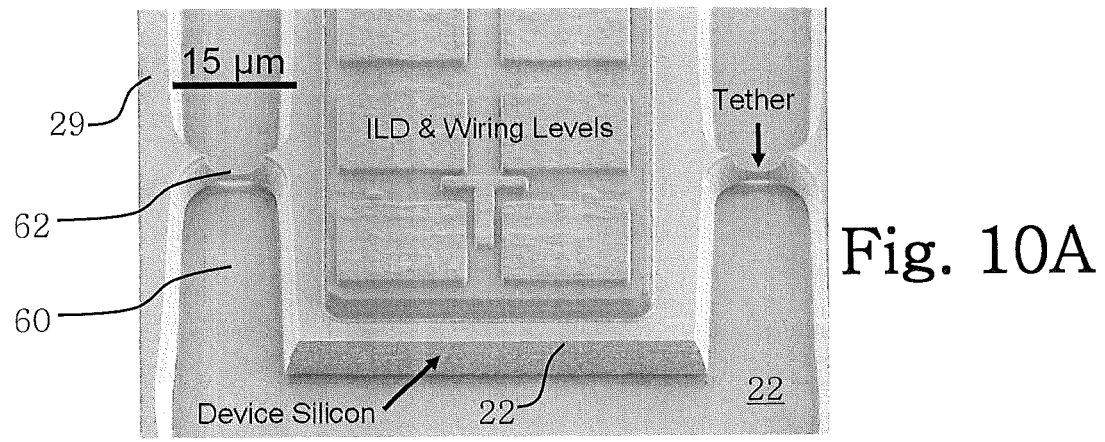
FIG. 10A is a photomicrograph of an active component before release from a source wafer according to an embodiment of the method of the present invention.

The sacrificial layer 26 is then removed in step 109, for example by etching with hydrofluoric acid and as shown in FIG. 8D. Care must be taken to ensure that the active components 22 are completely detached from the source substrate 20, except for tethers 62 (illustrated in FIG. 9 in a top view) while at the same time anchoring the tethers to an anchor portion 29 of the active layer 28 that remains attached to the source substrate 20 and sacrificial layer 26. To ensure this result, the relative width of the space between the active components 22 in the active layer 28 and the relative size and aspect ratio of the active components 22 must be carefully chosen, together with the etch rate and conditions to properly separate the active components 22 from the source substrate 20 without removing the anchor areas 29. The tethers can be protected from the etch step by coating the tethers 62 with an etch-resistant material or forming the tethers 62 from different, etch-resistant materials (using photo-lithographic processes). FIG. 10A is a photomicrograph of a silicon-based integrated circuit of approximately 40 microns by 140 microns by 10 microns in size having a trench 60 width of approximately 15 microns and tethers 62 anchoring the active component 22 to an anchor area 29 affixed to the source substrate 20 between the active components 22. The active component 22 includes metal wiring layers and electrical connection pads as well as interlayer dielectric (ILD) elements.

Figure 10B:
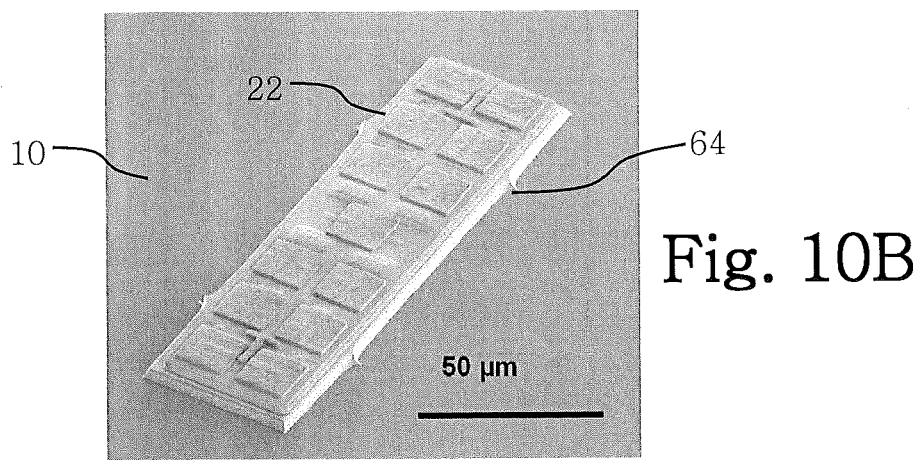
FIG. 10B is a photomicrograph of an active component adhered to a destination wafer according to an embodiment of the method of the present invention.

Referring back to FIGS. 1 and 7, once the active components are located on the source substrate (step 105), the active components can be applied to the selectively curable adhesive layer and the destination substrate (steps 110 and 115). The adhesive is selectively cured in the areas of selected active components (steps 120 and 122). The source substrate is then removed from the destination substrate in step 126 (analogous to step 125), breaking the tethers 62. FIG. 10B is a photomicrograph of the integrated circuit active component 22 of FIG. 10A showing the broken tethers or "tabs" 64.

Therefore, as illustrated in the Figures, a method for selectively transferring active components from a source substrate to a destination substrate according to some embodiments, can comprise the steps of providing a source wafer having a sacrificial layer formed over the source wafer and an active layer formed on the sacrificial layer, processing the source wafer to form one or more active component(s) in or on the active layer and a trench around each of the active component(s), the trench extending through the active layer to the sacrificial layer, and removing the sacrificial layer except for breakable tethers to release the active components from the source substrate. A destination substrate having a receiving side, is provided and a selectively curable adhesive layer located between and adjacent to the receiving side of the destination substrate and the active component side of the source wafer. The selectively curable adhesive layer has separate areas between each of the active component(s) and the receiving side of the destination substrate. One or more active components are selected, and the adhesive layer selectively cured in selected area(s) of the adhesive layer corresponding to the selected active components to adhere the selected active components to the receiving side of the destination substrate in the selected area(s). The tethers are broken by removing the source substrate and the adhesive layer from the destination substrate leaving the selected active components adhered to the receiving side of the destination substrate in the selected area(s).

Figure 11:
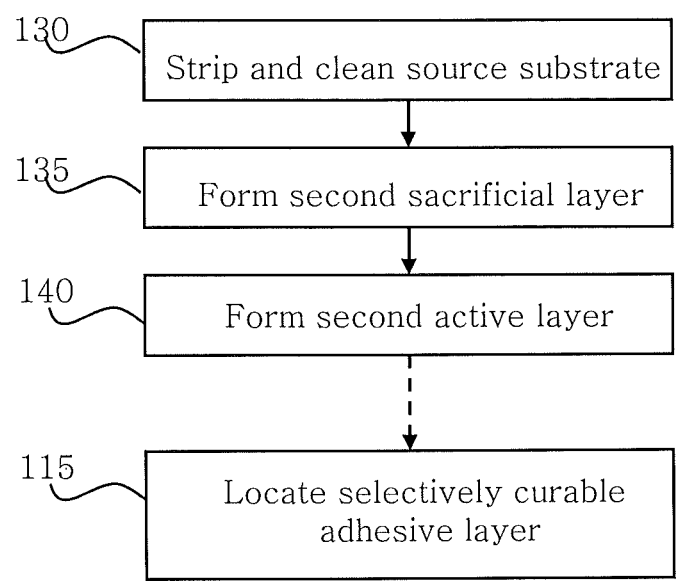
FIG. 11 is a flow diagram illustrating a method of reusing a source substrate according to an embodiment of the method of the present invention.

Referring to FIG. 11, once all of the active components to be used in a process are transferred, the source substrate can be stripped of the remaining active layer and sacrificial layer materials and cleaned in step 130. A second sacrificial layer can be formed over the source substrate in step 135 and a second active layer formed over the second sacrificial layer in step 140. The process of constructing new active components and adhering them to a new destination substrate can then be repeated, thereby reusing the source substrate. Likewise, if the active components were releasably adhered to a source substrate, the substrate could be cleaned of any remaining releasable adhesive and active components after the transfer processes are complete, and the source substrate reused.

Figure 14:
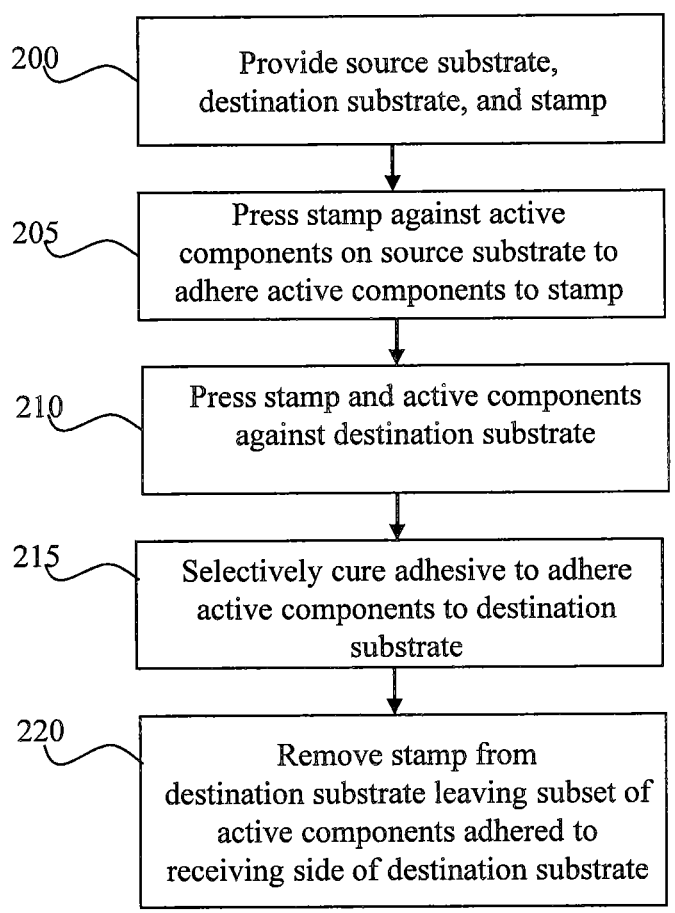
FIG. 14 is a flow diagram illustrating an alternative method according to an embodiment of the present invention.

Referring to FIG. 14, in still further embodiments of the present invention, active components are transferred from a source substrate to a destination substrate by providing a source substrate having an active side and one or more active components located on the active side of the source substrate, providing a destination substrate having a receiving side coated with a selectively curable adhesive, and providing a stamp in step 200. The active components can be released from the source substrate by photolithographic processing so that they are connected to the source substrate only by small tethers. The stamp is pressed against the active components, breaking the tethers and adhering the active components to the stamp in step 205. The stamp and active components are then pressed against a destination substrate coated with an unpatterned adhesive in step 210. The adhesive in the areas of the active components is selectively cured, for example by exposure to laser light, adhering the active components to the destination substrate in step 215. The exposure to light can be done through the destination substrate or through the stamp, if it is at least partially transparent. The stamp is then removed from the destination substrate in step 220. The process can be repeated as described above in FIGS. 12A-12D.

The stamp can be flat or structured, for example with protrusions matched to the shapes, sizes, and locations of the active components to enhance lamination. The stamp can be elastomeric, made of PDMS, rubber, or a reinforced composite.

The adhesion between the active components and the receiving side of the destination substrate is greater than the adhesion between the active components and the stamp. When the stamp is removed from the receiving side of the destination substrate, the active components must adhere more strongly to the receiving side than to the stamp, to transfer the active components from the stamp to the receiving side.

In one embodiment of the method illustrated in FIG. 14, the stamp adheres only a subset of the active components, for example a subset array of the available active components on the source substrate. When the adhesive is selectively cured, it is selectively cured in the areas of all of the active components transferred by the stamp. Subsequent stamping steps can then remove different subset arrays of active components from the source substrate and stamp them in different locations on the destination substrate to form a sparse array of active components adhered to the receiving side of the destination substrate.

In an alternative embodiment of the method of FIG. 14, all of the active components within an array on the source wafer are removed from the source wafer and adhered to the stamp. Likewise, all of the removed active components are stamped onto the receiving side of the destination wafer. However, only selected active components, for example a subset array of the active components on the stamp are adhered to the destination substrate by selectively curing the areas of the adhesive corresponding to the selected active components. The stamp is then removed from the destination substrate and can be reapplied elsewhere on the destination substrate to selectively adhere another, different subset array of active components to another different destination substrate area. In this embodiment, there is no need to repeatedly press the stamp against the source wafer, but the adhesion of the active components to the stamp must be stronger than the uncured adhesion to the destination substrate and weaker than the cured adhesion to the destination substrate.

Figure 15:
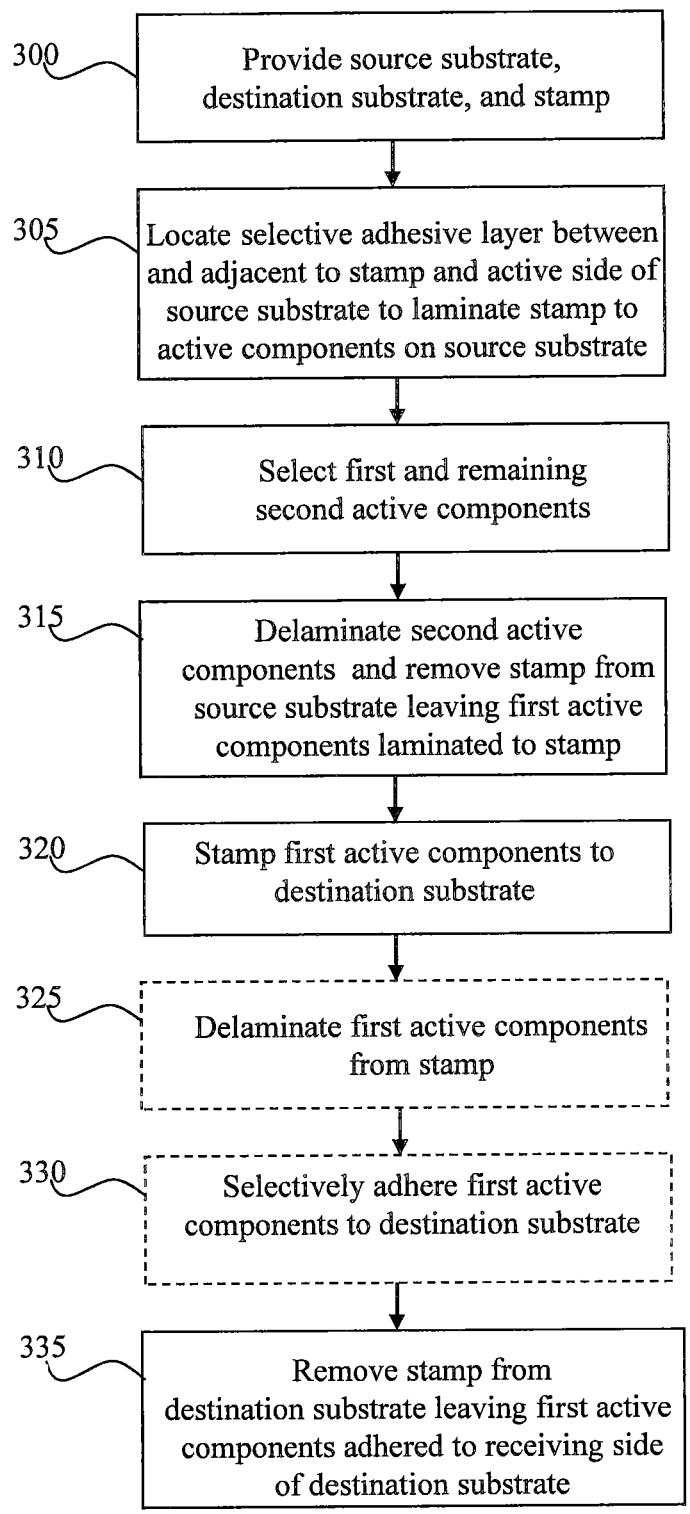
FIG. 15 is a flow diagram illustrating an alternative method according to an embodiment of the present invention.

Referring to FIG. 15, in an alternative method of the present invention, active components are transferred from a source substrate to a destination substrate by providing a source substrate having an active side and one or more active components located on the active side of the source substrate, providing a destination substrate having a receiving side, and providing a stamp in step 300. A selectively adhesive layer is located between and adjacent to the stamp and the active side of the source substrate, the selective adhesive layer having separate areas between each of the active component(s) and the stamp, thereby laminating the active components to the stamp in step 305. One or more first active components having corresponding first selected areas and one or more remaining second active components having corresponding second selected areas are selected in step 310.

The adhesive layer in the second selected area(s) is selectively delaminated and the stamp removed from the source substrate leaving the first active components laminated to the stamp in step 315. In contrast to the methods described above, in this method the adhesive is selectively disabled in the areas in which active components are not to be transferred, leaving the laminated first active components adhered to the stamp for transfer to a destination substrate. The first active components are stamped onto the receiving side of the destination substrate to adhere the first active components to the receiving side of the destination substrate in step 320. The stamp is removed from the destination substrate leaving the first active components adhered to the receiving side of the destination substrate in step 335.

The stamp can be flat or structured, for example with protrusions matched to the shapes and locations of the active components to enhance lamination. The stamp can be elastomeric, made of PDMS, rubber, or a reinforced composite.

The adhesion between the first active components and the receiving side is greater than the adhesion between the first active components and the stamp. When the stamp is removed from the receiving side of the destination substrate, the active components must adhere more strongly to the receiving side than to the stamp, to transfer the active components from the stamp to the receiving side.

To assist in the transfer process, in one embodiment of the present invention, the first areas corresponding to the first active components can be selectively delaminated to reduce the first active component adhesion to the stamp in optional step 325. Delamination of the selectively curable adhesive can be done by exposure to electromagnetic radiation, either through the stamp (if at least partially transparent) or through the back side of the active components. A selectively curable receiving adhesive, similar to that used in the methods described above can also be used to increase the adhesion between the first active components and the receiving side of the destination substrate before the stamp is removed from the receiving side by curing the receiving adhesive in the areas of the first active components in step 330. Note that the selectively curable adhesive between the stamp and the active components can be selectively delaminated to decrease the adhesive strength while the selectively curable receiving adhesive between the receiving side and the first active components can be selectively cured to increase the adhesive strength between the first active components and the receiving side. Adhesives that increase or decrease their adhesion in response to heat or radiation are known in the art.

Figure 13:
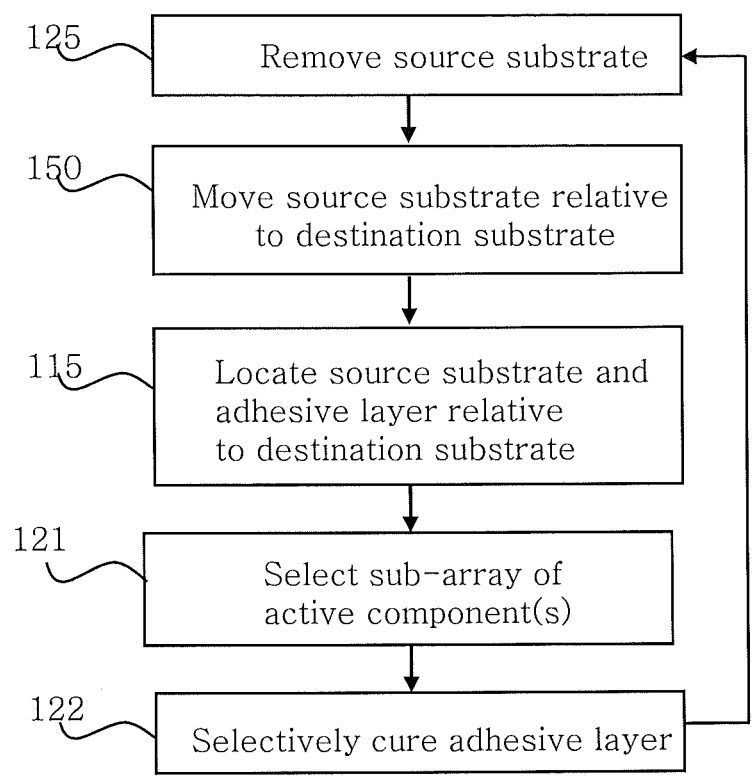
FIG. 13 is a flow diagram illustrating an iterative method according to an embodiment of the method of the present invention.

Referring to the illustrations of FIGS. 12A-12D and the flow diagram of FIG. 13, the method of the present invention can be iteratively applied to a single or multiple destination substrates 10. As shown in FIG. 12A, after the source substrate 20 is removed from the destination substrate 10 (step 125 of FIG. 13), one or more active components 22A remain affixed to the destination substrate 10. In one embodiment of the present invention, all of the active components 22 on the source substrate 20 can be adhered to the destination substrate 10. In another embodiment of the present invention, only one, or more than one, active component(s) 22 can be adhered to the destination substrate 10. As shown in FIG. 12A, a subset of the active components 22 is transferred to the destination substrate 10. The subset includes a regular array of active components 22 that are not adjacent to each other, for example every other active component 22 (as shown in FIG. 12A), every third active component 22, every tenth active component 22, and so on, forming a sub-array of active components 22. The sub-array can, but need not, be regular.

Once the subset of active components 22 is transferred and the source and destination substrates 20, 10 are separated (step 125 in FIG. 13), the source and destination substrates 20, 10 are moved relative to each other in a direction 50 in step 150, as indicated with the arrow in a FIG. 12A, to a position indicated in FIG. 12B. The process of adhering remaining active components 22 on the source substrate 20 can be repeated by locating the selectively curable adhesive layer 30 between and adjacent the active components 22 and the destination substrate 10 (in step 115), selecting desired active components 22 and the corresponding selected adhesive layer areas (step 121), selectively curing the selected areas with, for example laser light 40, as illustrated in FIG. 12C and step 122, and removing the source and destination substrate 20, 10, from each other, as shown in FIG. 12D (step 125 again). By ensuring that the relative movement of the source and destination substrates 20, 11 is equal to the spacing of the selected active components 22, a regular array of transferred active components 22A can be distributed over the destination substrate 10 in an iterative process as shown in FIG. 13. Although the illustrations of FIGS. 12A-12D are shown in cross section and the array of active components 22 is shown distributed in one dimension, the selection of active components 22 can be two-dimensional (as shown in FIG. 3), the relative movement of the source and destination substrates 20, 11 can likewise be two-dimensional, and the resulting array of transferred active components 22A adhered to the destination substrate 10 can likewise be two-dimensional and the array of transferred active components can be a regular two-dimensional array. Therefore, by repeatedly transferring sub-arrays of active components 22 from a source substrate 20 to a destination substrate 10 and relatively moving the source and destination substrates 20, 11 a distance equal to the spacing of the selected active components 22 in the transferred sub-array between each transfer of active components 22, an array of active components 22 formed at a high density on a source substrate 20 can be transferred to a destination substrate 10 at a much lower density. In practice, the source substrate 20 is likely to be expensive, and forming active components 22 with a high density on the source substrate 20 will reduce the cost of the active components 22, especially as compared to forming active components on the destination substrate. Transferring the active components 22 to a lower-density destination substrate 10 can be useful, for example, if the active components 22 manage elements distributed over the destination array, for example in a display, digital radiographic plate, or photovoltaic system.

According to various embodiments of the present invention, the adhesive layer can be located adjacent to or adhered to the destination substrate before the selected areas are cured. In an iterative process such as that described in FIGS. 12 and 13, the selectively curable layer can be left in place for repeated transfers of selected active components onto the same destination substrate from the same or different source substrates. Similarly, the selectively adhesive layer can be located adjacent to or adhered to the source substrate before the selected areas are cured and left in place for repeated transfers of selected active components from the same source substrate to the same or different destination substrates.

The selective curing of the selectively curable adhesive layer need not cure the adhesive over the entire selected area corresponding to the area taken by each of the entire selected active component(s). It is only necessary to cure enough adhesive over a sufficient area to adhere the active components to the destination substrate when the source substrate is removed. In particular, for an active component that has sufficient mechanical robustness and cohesion, only a portion of the active component need be adhered to the destination substrate. As the source substrate is removed, the adhered portion will keep the remainder of the active components adjacent to the destination substrate rather than tearing the active component into separate portions, one of which remains adhered to the destination substrate and another that remains with the source substrate. An active component can have multiple adhered portions adhered to the destination substrate.

In particular, in the case wherein the active component is an integrated circuit formed in a crystalline semiconductor material, the integrated circuit substrate provides sufficient cohesion, strength, and flexibility that it can adhere to the destination substrate without breaking as the source substrate is removed. In one embodiment of the present invention in which an integrated circuit active component is formed in a wafer substrate and released from the wafer by etching except for tethers connecting the integrated circuit to anchor areas in the source substrate (as shown in FIGS. 10A and 10B), the active component can be advantageously adhered in the selected areas adjacent to the tethers to minimize the strain experienced by the active component integrated circuit when the source substrate is removed from the destination substrate to which the integrated circuit active component is adhered.

Therefore, in some cases of the present invention, it is not necessary to adhere the entire selected active component to the destination substrate, providing an advantage as compared to some methods of the prior art.

In various methods of the present invention, laser beams are used to selectively cure the selected adhesive areas. In one embodiment, the selected areas can be sequentially exposed. In another embodiment, multiple areas can be simultaneously exposed; thereby increasing the number of selected active components simultaneously adhered. An alternative method employing a mask can also adhere multiple selected active components at one time, thereby increasing the rate at which destination substrates can be populated. Means known in the art for scanning and controlling lasers can be employed, as well as light sources used in conjunction with aligned masks, particularly as are known in the photo-lithographic arts.

The present invention provides advantages in comparison to other transfer methods that may be known in the art. For example, by locating an entire layer of selectively curable adhesive adjacent to the active components and destination substrate and only curing selected areas, there is no need for patterning adhesive over a substrate, a particularly important advantage for a large substrate. By employing adhesion over selected areas and active components capable of withstanding transfer stress, there is no need for ablation of material on which an active component is formed or that is formed on an active component, thereby reducing the likelihood of damage to the active components and rendering a difficult-to-control process unnecessary. Furthermore, there is no need to accurately shape or locate the energy used for ablation since the transferring active component can have sufficient mechanical cohesion to avoid cracking or breaking under the stress of transfer. Furthermore, the methods of the present invention can be robust in the presence of particulate contamination that is problematic for other traditional transfer methods.

In comparison to thin-film manufacturing methods, using densely populated source substrates and transferring active components to a destination wafer that requires only a sparse array of active components located thereon does not waste or require active layer material on a destination wafer. The present invention is also useful in transferring active components made with crystalline semiconductor materials that have much higher performance than thin-film active components. Furthermore, the flatness, smoothness, chemical stability, and heat stability requirements for a destination substrate useful in the present invention are greatly reduced because the adhesion and transfer process is not significantly limited by the destination substrate material properties. Manufacturing and material costs are reduced because of high utilization rates of expensive materials (e.g. the source substrate) and reduced material and processing requirements for the destination substrate.

The invention has been described in detail herein with particular reference to certain embodiments thereof, but it will be understood that variations and modifications can be effected within the spirit and scope of the invention.

The invention claimed is:
1. A method for selectively transferring active components, the method comprising:
   providing a curable adhesive layer between a receiving surface and a surface of a substrate including the active components thereon;
   after providing the curable adhesive layer, assembling the substrate on the receiving surface such that the curable adhesive layer contacts the active components and the receiving surface;

after assembling, selectively curing portions of the curable adhesive layer in contact with ones of the active components without curing other portions thereof, wherein the cured portions respectively comprise less than an entirety of a contact area between the respective ones of the active components and the adhesive layer; and then after selectively curing, separating the substrate from the receiving surface such that the ones of the active components on the cured portions of the curable adhesive layer are transferred to the receiving surface.

2. The method of claim 1, wherein selectively curing comprises selectively irradiating the portions of the curable adhesive layer with light, heat, and/or electromagnetic energy.

3. The method of claim 2, wherein selectively irradiating comprises:

providing a mask that exposes the portions of the curable adhesive layer in contact with the ones of the active components; and selectively irradiating the portions of the curable adhesive layer exposed by the mask.

4. The method of claim 2, wherein the receiving surface comprises an at least partially transparent destination substrate, and wherein selectively irradiating comprises:

selectively transmitting a laser through the destination substrate to selectively irradiate the portions of the curable adhesive layer in contact with the ones of the active components.

5. The method of claim 2, wherein the substrate and the active components are at least partially transparent, and wherein selectively irradiating comprises:

selectively transmitting a laser through the substrate and the ones of the active components to selectively irradiate the portions of the curable adhesive layer.

6. The method of claim 1, wherein the receiving surface comprises a flexible and/or a polymer destination substrate.

7. The method of claim 1, wherein the substrate comprises a stamp, and wherein assembling the substrate on the receiving surface comprises pressing the stamp on the receiving surface.

8. The method of claim 7, further comprising:

pressing the stamp on a source substrate including the active components releasably adhered thereto; and separating the stamp from the source substrate to transfer the active components from the source substrate to the stamp prior to pressing the stamp on the receiving surface.

9. The method of claim 1, wherein the ones of the active components transferred to the receiving surface comprise first ones of the active components transferred to a first area of the receiving surface, and further comprising the following after separating the substrate from the receiving surface:

aligning the substrate with a second area of the receiving surface, the substrate including second ones of the active components remaining thereon;

assembling the substrate on the second area of the receiving surface such that the curable adhesive layer contacts second ones of the active components and the receiving surface;

selectively curing second portions of the curable adhesive layer in contact with the second ones of the active components; and then separating the substrate from the second area of the receiving surface such that the second ones of the active components on the cured second portions of the curable adhesive layer are transferred to the second area of the receiving surface.

10. The method of claim 9, wherein aligning the substrate comprises moving the substrate in one or two dimensions relative to the receiving surface such that the first and second ones of the active components thereon define a one- or two-dimensional array of active components.

11. The method of claim 1, wherein the adhesive layer is provided on the active components, wherein the ones of the active components transferred to the receiving surface comprise first ones of the active components, and further comprising the following after separating the substrate from the receiving surface:

assembling the substrate including second ones of the active components remaining thereon on a second receiving surface such that the adhesive layer is in contact with the second ones of the active components and the second receiving surface; and selectively curing portions of the adhesive layer in contact with the second ones of the active components and then separating the substrate from the second receiving surface to transfer the second ones of the active components to the second receiving surface.

12. The method of claim 1, wherein the adhesive layer is provided on the receiving surface, wherein the active components comprise first active components, and further comprising:

assembling a second substrate including second active components thereon on the receiving surface such that the adhesive layer contacts the second active components; and selectively curing second portions of the adhesive layer in contact with the second active components and then separating the second substrate from the receiving surface to transfer the second active components to the receiving surface.

13. The method of claim 1, wherein, after separating the substrate from the receiving surface, the method further comprises:

cleaning the substrate; and providing second active components on the surface of the substrate for transfer to the receiving surface and/or another receiving surface.

14. The method of claim 1, wherein the surface of the substrate including the active components thereon is free of a curable adhesive layer therebetween.

15. A method for selectively transferring active components, the method comprising:

providing a curable adhesive layer between a receiving surface and a surface of a substrate including the active components thereon;

assembling the substrate on the receiving surface such that the curable adhesive layer contacts the active components and the receiving surface;

selectively curing portions of the curable adhesive layer in contact with ones of the active components without curing other portions thereof, wherein the cured portions respectively comprise less than an entirety of a contact area between the respective ones of the active components and the adhesive layer; and then separating the substrate from the receiving surface such that the ones of the active components on the cured portions of the curable adhesive layer are transferred to the receiving surface, wherein the substrate comprises a source substrate, and wherein the active components are releasably adhered to the source substrate by a plurality of tethers.

16. The method of claim 15, wherein providing a curable adhesive layer is preceded by:
providing a sacrificial layer and an active layer on the source substrate;
processing the active layer to define the active components and the plurality of tethers connecting the active components to anchor areas of the active layer;
removing portions of the sacrificial layer between the active components and the source substrate such that the active components are releasably adhered to the source substrate by the plurality of tethers.

17. The method of claim 16, wherein the plurality of tethers include an etch-resistant material, and wherein removing the portions of the sacrificial layer comprises:
selectively etching the sacrificial layer without substantially etching the plurality of tethers.

18. The method of claim 16, wherein the active layer comprises a crystalline, microcrystalline, polycrystalline, or amorphous semiconductor layer.

19. The method of claim 18, wherein the active layer has a thickness of greater than about 5 microns.

20. The method of claim 15, wherein separating the substrate from the receiving surface comprises breaking ones of the plurality of tethers that are connected to the ones of the active components in contact with the cured portions of the adhesive layer.

21. A method for selectively transferring active components, the method comprising:
pressing a stamp on a source substrate including active components releasably adhered thereto;
separating the stamp from the source substrate to transfer the active components from the source substrate to the stamp prior to pressing the stamp on a receiving surface;
providing a curable adhesive layer between the receiving surface and a surface of the stamp including the active components thereon;
pressing the stamp on the receiving surface such that the curable adhesive layer contacts the active components and the receiving surface;
selectively curing portions of the curable adhesive layer in contact with ones of the active components without curing other portions thereof, wherein the cured portions respectively comprise less than an entirety of a contact area between the respective ones of the active components and the adhesive layer; and then
separating the stamp from the receiving surface such that the ones of the active components on the cured portions of the curable adhesive layer are transferred to the receiving surface,
wherein the active components are releasably adhered to the source substrate by a plurality of tethers, and wherein pressing the stamp on the source substrate comprises breaking ones of the plurality of tethers that are connected to the active components.

22. A method for selectively transferring active components from a source substrate to a destination substrate, comprising the steps of:
a) providing a source wafer having a sacrificial layer formed over the source wafer and an active layer formed on the sacrificial layer;
b) processing the source wafer to form one or more active component(s) in or on the active layer and a trench around each of the active component(s), the trench extending through the active layer to the sacrificial layer;
c) removing the sacrificial layer except for breakable tethers to release the active components from the source substrate;
d) providing a destination substrate having a receiving side;
e) locating a selectively curable adhesive layer between and adjacent to the receiving side of the destination substrate and the active component side of the source wafer, the selectively curable adhesive layer having separate areas between each of the active component(s) and the receiving side of the destination substrate;
f) selecting one or more active components;
g) selectively curing the adhesive layer in selected area(s) of the adhesive layer corresponding to the selected active components to adhere the selected active components to the receiving side of the destination substrate in the selected area(s); and
h) breaking the tethers by removing the source substrate and the adhesive layer from the destination substrate leaving the selected active components adhered to the receiving side of the destination substrate in the selected area(s).

23. A method for selectively transferring active components from a source substrate to a destination substrate, comprising the steps of:
a) providing a source substrate having an active side and one or more active components located on the active side of the source substrate;
b) providing a destination substrate having a receiving side coated with a selectively curable adhesive;
c) providing a stamp;
d) pressing the stamp against the active components to adhere the active components to the stamp;
e) stamping the active components onto the receiving side of the destination substrate to adhere the first active components to the receiving side of the destination substrate;
f) selectively curing the selectively curable adhesive layer in the areas corresponding to the active components;
g) removing the stamp from the destination substrate leaving the first active components adhered to the receiving side of the destination substrate.

24. A method for selectively transferring active components from a source substrate to a destination substrate, comprising the steps of:
a) providing a source substrate having an active side and one or more active components located on the active side of the source substrate;
b) providing a destination substrate having a receiving side;
c) providing a stamp;
d) locating a selectively adhesive layer between and adjacent to the stamp and the active side of the source substrate, the selectively adhesive layer having separate areas between each of the active component(s) and the stamp, thereby laminating the active components to the stamp;
e) selecting one or more first active components having corresponding first selected areas and one or more remaining second active components having corresponding second selected areas;
f) selectively delaminating the selectively adhesive layer in the second selected area(s) and removing the stamp from the source substrate leaving the first active components laminated to the stamp; and
g) stamping the first active components onto the receiving side of the destination substrate to adhere the first active components to the receiving side of the destination substrate;

h) removing the stamp from the destination substrate leaving the first active components adhered to the receiving side of the destination substrate.

\* \* \* \* \*